US009881928B2

(12) United States Patent
Denorme et al.

(10) Patent No.: US 9,881,928 B2
(45) Date of Patent: *Jan. 30, 2018

(54) METHOD FOR PRODUCING ONE-TIME-PROGRAMMABLE MEMORY CELLS AND CORRESPONDING INTEGRATED CIRCUIT

(71) Applicant: STMicroelectronics SA, Montrouge (FR)

(72) Inventors: Stéphane Denorme, Crolles (FR); Philippe Candelier, Saint Mury Monteymond (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/413,497

(22) Filed: Jan. 24, 2017

(65) Prior Publication Data

US 2017/0133390 A1    May 11, 2017

Related U.S. Application Data

(63) Continuation of application No. 14/952,662, filed on Nov. 25, 2015, now Pat. No. 9,589,968.

(30) Foreign Application Priority Data

May 19, 2015  (FR) ..................... 15 54457

(51) Int. Cl.
*H01L 27/112* (2006.01)
*H01L 21/84* (2006.01)
(Continued)

(52) U.S. Cl.
CPC .. *H01L 27/11206* (2013.01); *H01L 21/28097* (2013.01); *H01L 21/7624* (2013.01);
(Continued)

(58) Field of Classification Search
CPC .......... H01L 27/11206; H01L 21/7624; H01L 29/0649; H01L 29/66181; H01L 29/4975;
(Continued)

(56) References Cited

U.S. PATENT DOCUMENTS 6,828,632 B2    12/2004  Bhattacharyya
7,995,369 B2    8/2011   Minami et al.
(Continued)

FOREIGN PATENT DOCUMENTS

WO     2006111888 A1    10/2006

*Primary Examiner* — William Coleman
(74) *Attorney, Agent, or Firm* — Slater Matsil, LLP

(57) ABSTRACT

An integrated circuit includes a silicon-on-insulator substrate that includes a semiconductor film located above a buried insulating layer. A first electrode of a silicide material overlies the semiconductor film. A sidewall insulating material is disposed along sidewalls of the first electrode. A dielectric layer is located between the first electrode and the semiconductor film. A second electrode includes a silicided zone of the semiconductor film, which is located alongside the sidewall insulating material and extends at least partially under the dielectric layer and the first electrode. The first electrode, the dielectric layer and the second electrode form a capacitor that is part of a circuit of the integrated circuit.

20 Claims, 6 Drawing Sheets

(51) Int. Cl.
*H01L 23/525* (2006.01)
*H01L 27/12* (2006.01)
*H01L 21/28* (2006.01)
*H01L 29/40* (2006.01)
*H01L 29/49* (2006.01)
*H01L 29/66* (2006.01)
*H01L 21/762* (2006.01)
*H01L 29/06* (2006.01)
*H01L 21/8234* (2006.01)
*H01L 27/06* (2006.01)

(52) U.S. Cl.
CPC .......... *H01L 21/84* (2013.01); *H01L 23/5252* (2013.01); *H01L 27/1203* (2013.01); *H01L 29/0649* (2013.01); *H01L 29/401* (2013.01); *H01L 29/4975* (2013.01); *H01L 29/66181* (2013.01); *H01L 21/823418* (2013.01); *H01L 27/0629* (2013.01); *H01L 2924/0002* (2013.01)

(58) Field of Classification Search
CPC ............ H01L 21/28097; H01L 29/401; H01L 23/5252; H01L 27/1203; H01L 21/84; H01L 27/0629
See application file for complete search history.

(56) References Cited

U.S. PATENT DOCUMENTS

| | | |
|---|---|---|
| 8,748,258 B2 | 6/2014 | Cheng et al. |
| 8,927,422 B2 | 1/2015 | Alptekin et al. |
| 2009/0224321 A1 | 9/2009 | Tsuchiya |
| 2011/0127591 A1 | 6/2011 | Kubota et al. |
| 2014/0203363 A1 | 7/2014 | Adam et al. |
| 2014/0231895 A1 | 8/2014 | Rothleitner |

METHOD FOR PRODUCING ONE-TIME-PROGRAMMABLE MEMORY CELLS AND CORRESPONDING INTEGRATED CIRCUIT

CROSS-REFERENCE TO RELATED APPLICATIONS

This application is a continuation of U.S. application Ser. No. 14/952,662, filed Nov. 25, 2015, which claims priority to French Application No. 1554457, filed on May 19, 2015, which applications are hereby incorporated herein by reference.

TECHNICAL FIELD

Modes of implementation and embodiments of the invention relate to one-time-programmable memory cells, known to the person skilled in the art by the acronym "OTP."

BACKGROUND

A memory cell of the one-time-programmable type generally comprises a capacitor, for example of the MOS type, possessing a dielectric layer between its two electrodes and operates as an anti-fuse whose state is modified in an irreversible manner, for example through breakdown of the dielectric layer, by applying a high programming voltage to the memory cell, in such a way that the memory cell passes from a non-conducting state to a conducting state, this amounting to changing its resistance.

In advanced CMOS technologies, elevated source and drain regions of the transistors, for example planar CMOS transistors, FinFET transistors or transistors produced on a substrate on insulator, for example a substrate of the FDSOI ("Fully Depleted Silicon-On-Insulator") type, are formed by epitaxy.

A substrate of the silicon on insulator type comprises a semiconductor film, made for example of silicon or silicon alloy, such as a silicon-germanium alloy, situated above a buried insulating layer, commonly referred to by the acronym "BOX" ("Buried OXide") itself situated above a carrier substrate, for example a semiconductor well.

In an FDSOI substrate, the silicon film is fully depleted (the semiconductor material is intrinsic) and has a particularly low thickness of the order of a few nanometers.

The use of elevated source and drain regions makes it possible to solve problems of reliability, such as the hot carrier reliability (HCI: Hot Carrier Injection) of the transistors and also the problem of the mechanical resilience of the metal silicide.

In general, the MOS capacitors of OTP memory cells are produced jointly with the MOS transistors by using similar method steps.

However, these epitaxied elevated regions do not have any impact on the performance of the MOS capacitors, both as regards the breakdown of the dielectric layer, and as regards the reading voltage, the leakage of the capacitor or else others of these electrical characteristics.

SUMMARY

As noted above, elevated source and drain regions are utilized with certain integrated circuits. However, these epitaxied elevated regions do not have any impact on the performance of the MOS capacitors in an OPT, both as regards the breakdown of the dielectric layer, and as regards the reading voltage, the leakage of the capacitor or else others of these electrical characteristics.

Thus, according to one mode of implementation and embodiment, it is proposed to improve, especially at the reading level, the performance of the MOS capacitors produced jointly with MOS transistors, the formation of whose source and drain regions comprises an epitaxy of a semiconductor material on the basis of one and the same SOI, in particular FDSOI, substrate.

According to one aspect, there is proposed a method, comprising a production of at least one memory cell of the one-time-programmable type that can be used for producing an MOS capacitor in and/or on a semiconductor film of a substrate of the silicon on insulator type. A first electrode region is formed by at least partial silicidation of an insulated gate region resting on the semiconductor film and flanked by an insulating lateral region. A second electrode region is formed by silicidation of a zone of the semiconductor film, situated alongside the insulating lateral region. The zone of the semiconductor film has no previous epitaxy process formed before the silicidation.

Thus, the fact of directly siliciding the semiconductor film allows diffusion of the silicided regions under the gate dielectric, thereby decreasing the read-access resistance and making it possible to apply a lower reading voltage.

The dielectric's breakdown performance is also improved (reduced breakdown voltage and/or decreased breakdown time).

Whether or not the silicided regions join up under the dielectric layer depends on the gate length.

Moreover, still greater effectiveness is obtained when the gate region is fully silicided.

The method can also be used in the production of a MOS transistor, the formation of whose source and drain regions comprises an epitaxy of a semiconductor material on the semiconductor film. In this case, the formation of the second electrode region comprises a protection of the semiconductor film zone by at least one insulating layer during the epitaxy of the source and drain regions.

The substrate can be of the fully depleted silicon on insulator type.

According to another aspect, an integrated circuit comprises a substrate of the silicon on insulator type possessing a semiconductor film located above a buried insulating layer. A memory cell of the one-time-programmable type comprises an MOS capacitor having a first electrode region including a gate region at least partially silicided and flanked by an insulating lateral, a dielectric layer situated between the gate region and the semiconductor film, and a second electrode region including a silicided zone of the semiconductor film, situated alongside the insulating lateral region and extending at least partially under the dielectric layer.

Advantageously, the silicided zone of the semiconductor film can extend fully under the dielectric layer.

The integrated circuit can furthermore comprise at least one MOS transistor having elevated source and drain regions.

The substrate can for example be of the fully depleted silicon on insulator type.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION OF ILLUSTRATIVE EMBODIMENTS

Figure 1:
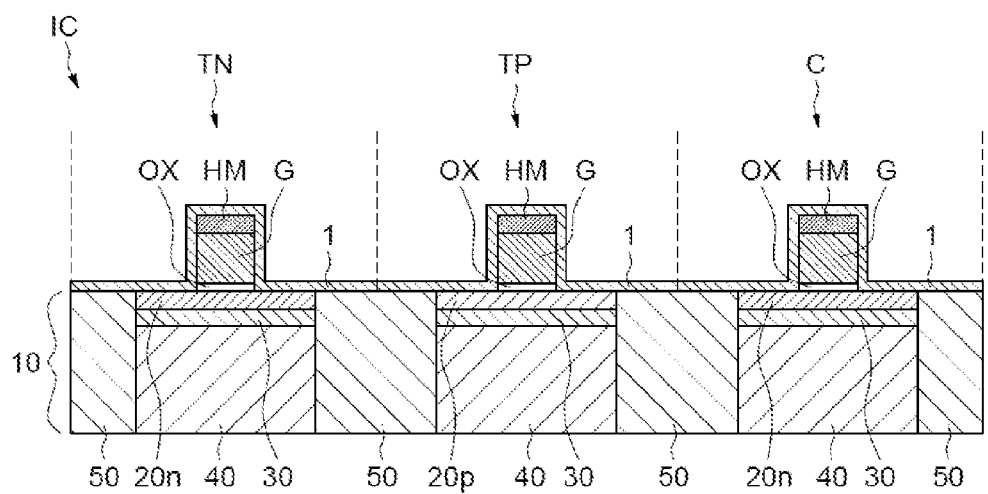
FIGS. 1 to 11 schematically illustrate modes of implementation and embodiments of the invention.

In FIG. 1, the reference IC refers to an integrated circuit in which one wishes to produce an MOS capacitor C jointly with an nMOS transistor TN and with a pMOS transistor TP on one and the same semiconductor substrate of the fully depleted silicon on insulator type 10.

This substrate comprises here a semiconductor thin film 20n and 20p typically possessing a thickness of the order of a few nanometers and resting on a buried oxide layer 30, commonly referred to by the person skilled in the art by the term "BOX". This buried oxide layer 30 is typically made of silicon dioxide and itself rests on a carrier substrate 40 which can be formed by wells.

The substrate 10 furthermore comprises insulating regions comprising for example shallow trenches 50 (STI: "Shallow Trench Isolation") that mutually isolate the nMOS transistor TN, the pMOS transistor TP and the capacitor C.

Depending on the type of conductivity of the nMOS or pMOS transistors, the semiconductor thin film can comprise a hetero-material and can be doped with dopants of type N or of type P or else even be undoped. The capacitor C rests here on a thin film of the same type as that used for the nMOS transistors. Of course, it would also be possible for it to rest on a thin film of the same type as that used for the pMOS transistors.

As illustrated in FIG. 1, gate regions G insulated from the substrate 10 by a dielectric layer OX advantageously comprising a material with a large dielectric constant K ("high-K" materials) are firstly formed above the substrate 10, in a conventional manner known per se.

The gate region G comprises for example above the layer OX a polysilicon layer.

One is dealing here typically with a "gate first" type architecture since the gate region G is formed before the production of the elevated source and drain regions.

A hard mask layer HM, made for example of silicon nitride, protects each gate region G from the posterior steps which will now be described.

A compliant deposition of a first layer 1 comprising a first insulating material is carried out firstly for example by atomic layer deposition commonly known to the person skilled in the art by the acronym "ALD." This first insulating material can for example be silicon nitride and its thickness is for example of the order of 10 nm.

Figure 2:
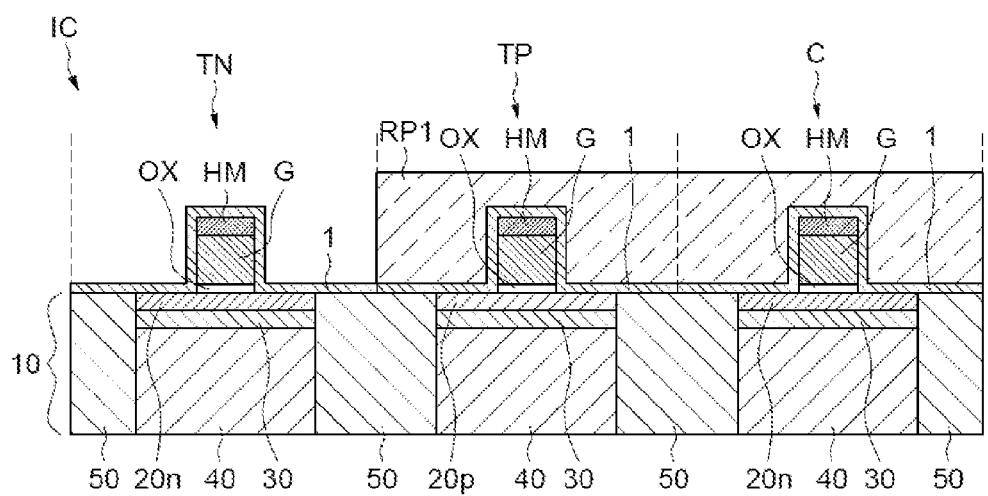

For the production of the elevated source and drain regions of the nMOS transistor TN, the transistor TP and the capacitor C are protected by a resin block RP1 formed conventionally by photolithography, as illustrated in FIG. 2.

Next, a first anisotropic etching of the first layer 1 is performed (FIG. 3) so as to uncover the semiconductor film 20n and form a first insulating layer CI1 on the flanks of the insulated gate region G of the nMOS transistor TN. This selective anisotropic etching down to the silicon layer can be a dry etching of the reactive ion etching ("RIE") type well known to the person skilled in the art.

The thickness of the first insulating layer CI1 is, for example, equal to 6 nm.

The resin block RP1 is thereafter removed and a pre-epitaxy treatment for cleaning the thin film 20n is for example performed on either side of the gate region G of the nMOS transistor TN.

Figure 3:
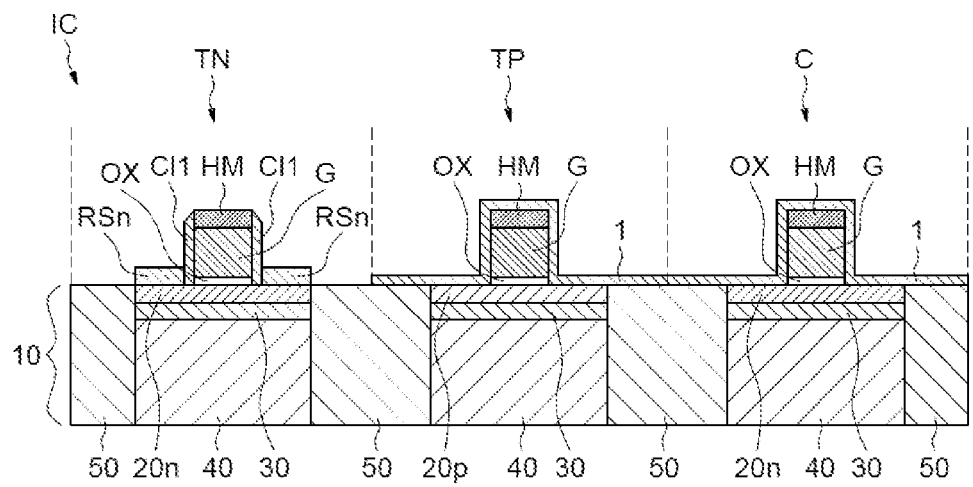

Next, as illustrated in FIG. 3, an epitaxy of an N-doped semiconductor material, for example SiCP, is undertaken on the semiconductor film 20n so as to form elevated source and drain regions RSn disposed on the first insulating layer CI1 on each side of the gate region G of the nMOS transistor.

Figure 4:
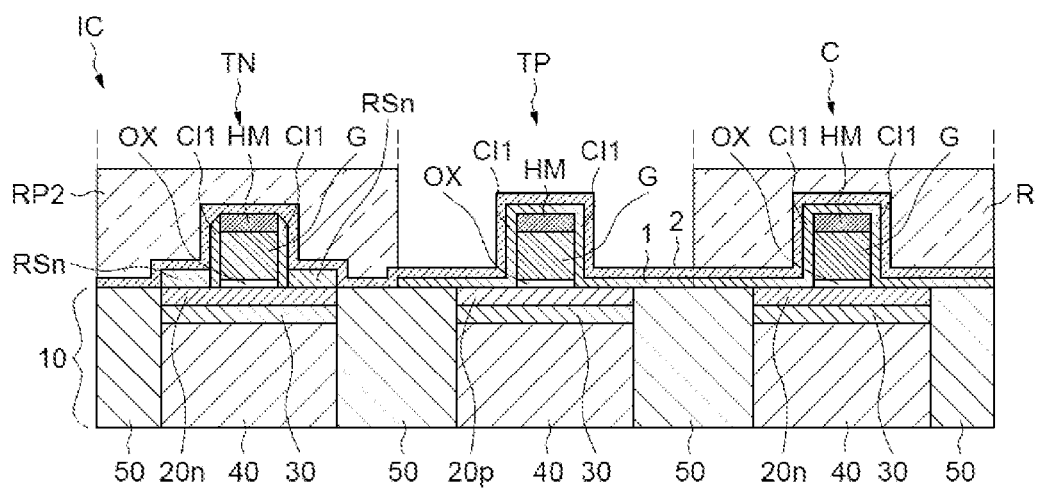

The production of the elevated source and drain regions for the pMOS transistor TP is thereafter prepared (FIG. 4).

A compliant deposition of a second protection layer 2 comprising a second insulating material is firstly carried out on the structure of FIG. 3, for example, by a deposition of ALD type. This second insulating material can for example be silicon dioxide $SiO_2$, and the thickness of the layer 2 can be of the order of 7 nm.

Two resin blocks RP2 are thereafter formed by photolithography above the nMOS transistor and the capacitor C.

A second anisotropic etching of the second layer 2 and of the first layer 1 in the region of the pMOS transistor TP is performed thereafter so as to uncover the semiconductor film 20p and form a second insulating layer CI2 on the flanks of the first insulating layer CI1 resting on the insulated gate region G of the pMOS transistor TP.

The thickness of the second insulating layer CI2 is for example of the order of 3 nm.

Figure 5:
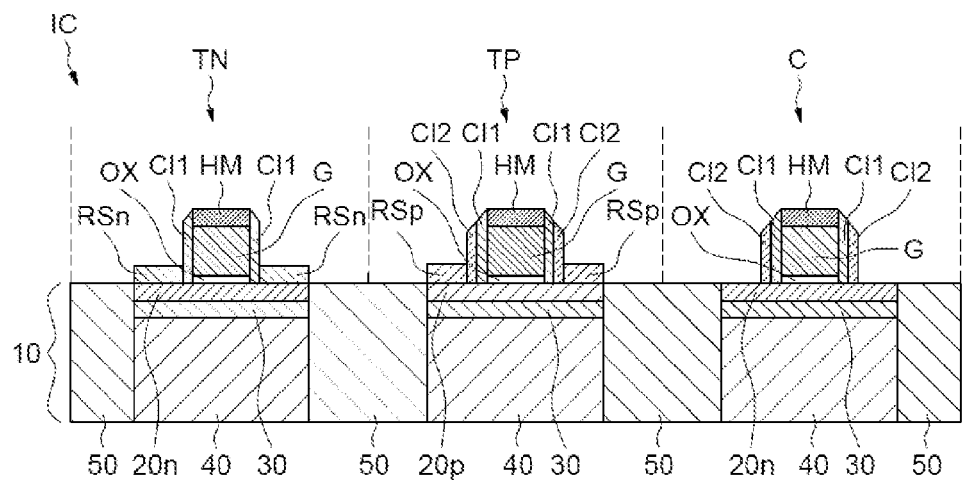

Subsequent to withdrawal of the resin blocks RP2, an epitaxy of a P-doped semiconductor material, for example SiGeB, is performed on the semiconductor film top so as to form elevated source and drain regions RSp on either side of the gate region G of the pMOS transistor TP and resting on the second insulating layer CI2, as is illustrated in FIG. 5.

It should be noted that the source and drain regions RSn of the nMOS transistor TN and the semiconductor film zone situated on either side of the gate region G of the capacitor C are respectively protected by the second protection layer 2 and by the layers 1 and 2, during the epitaxy of the source and drain regions of the pMOS transistor TP.

Thus, after withdrawal of the protection layers 1 and 2 by virtue of an etching step of RIE type, an nMOS transistor TN and a pMOS transistor TP having elevated source and drain regions are obtained. On the other hand, as illustrated in FIG. 5, the capacitor C does not possess any epitaxied elevated regions on either side of its gate region G.

Figure 6:
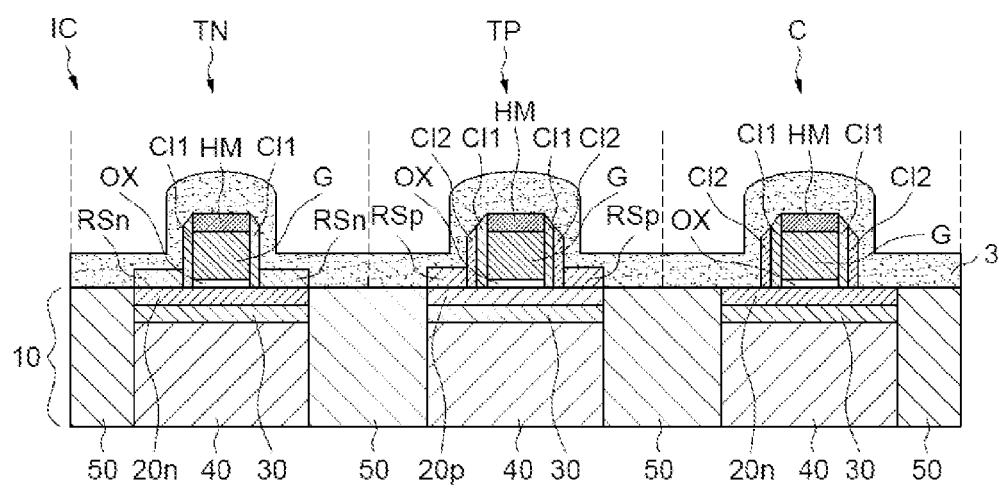

Next, a third protection layer 3, made for example of silicon dioxide, is deposited on the structure of FIG. 5 (FIG. 6).

Figure 7:
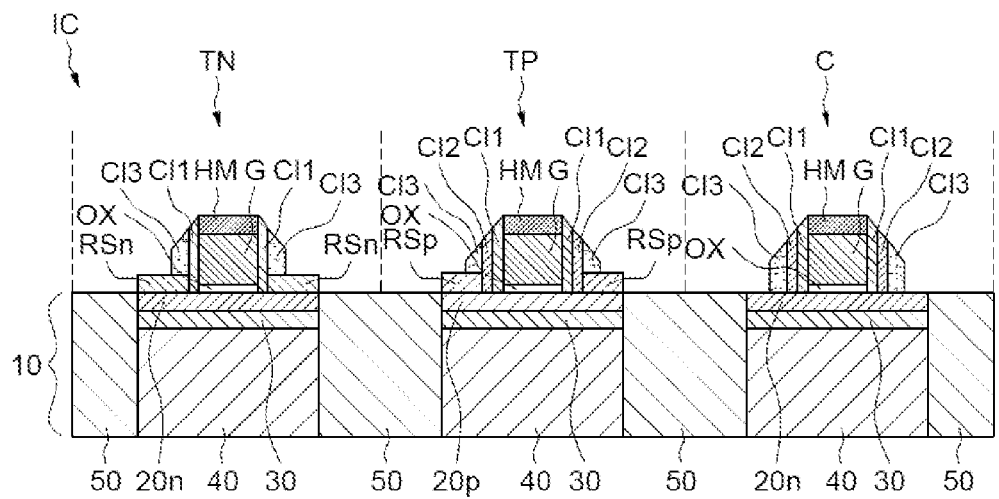

A third anisotropic etching of the third layer 3 is performed thereafter so as to form a third insulating layer CI3 resting on the flanks of the second insulating layer CI2 (FIG. 7).

Figure 8:
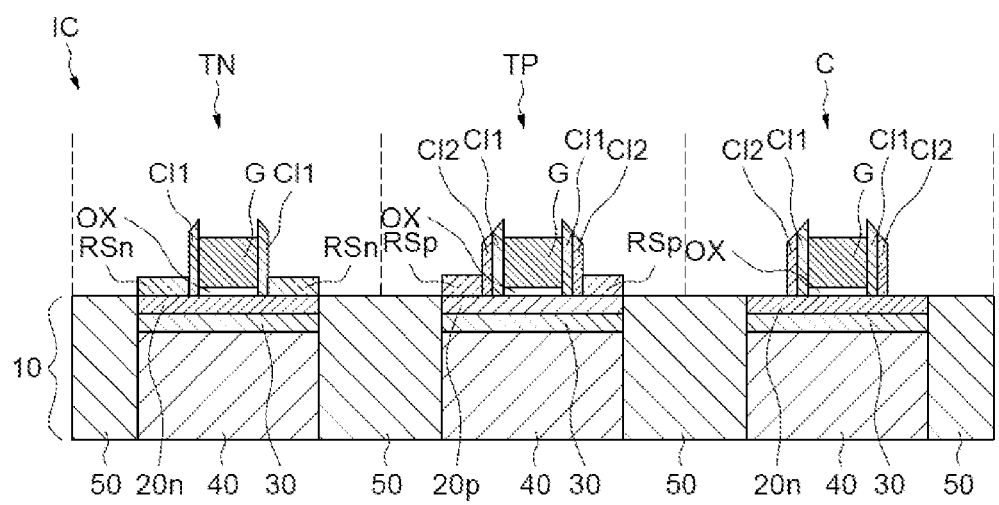

The silicon nitride hard mask HM is removed by wet etching. A surface cleaning is performed thereafter by means of hydrofluoric acid so as to obtain the structure as illustrated in FIG. 8.

Figure 9:
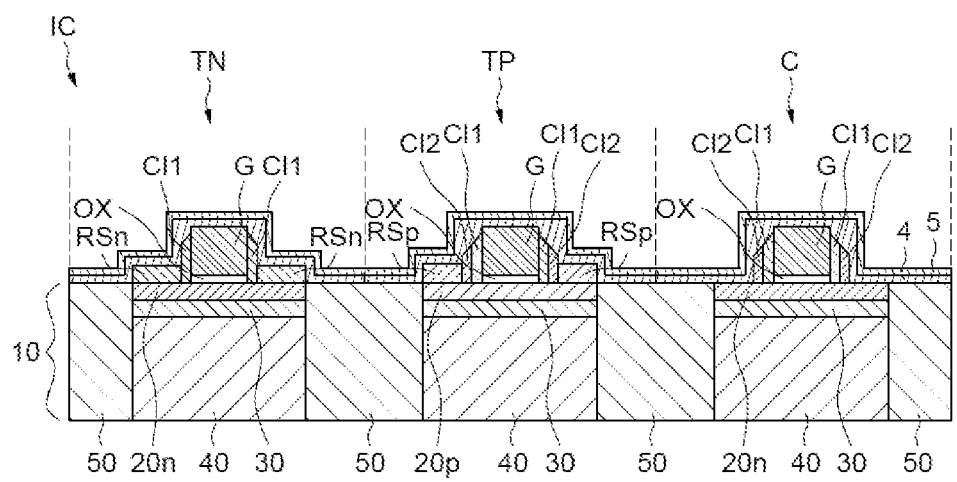

Before undertaking the silicidation step, the whole of the integrated circuit is covered with a bilayer 4, 5 (oxide-nitride for example) known to the person skilled in the art by the acronym "SiProt" ("Silicon Protection") (FIG. 9).

This bilayer serves to protect the zones (not represented in the figures) of the integrated circuit which must not be silicided. The bilayer 4, 5 is thereafter etched so as to uncover the regions to be silicided and form a fifth insulating layer CI5 resting on the flanks of a fourth insulating layer CI4 itself resting on the flanks of the second insulating layer CI2.

Figure 10:
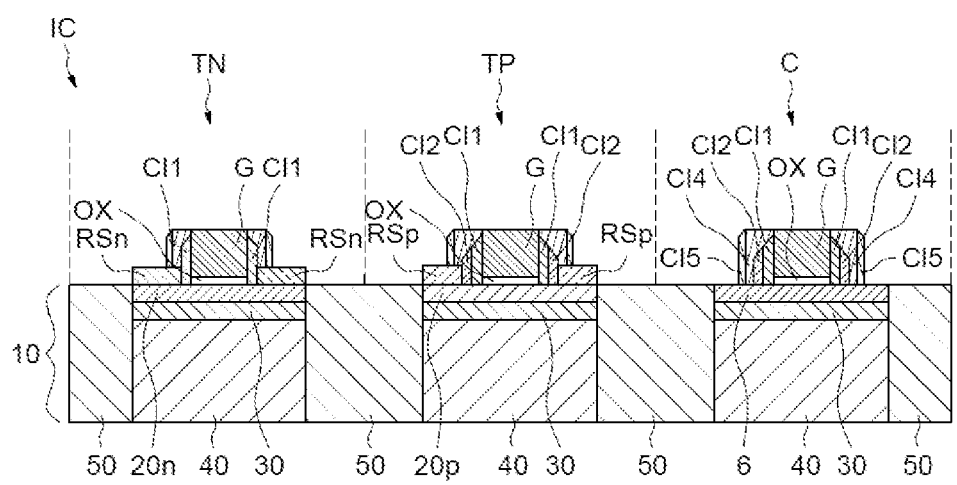

The regions envisaged for silicidation comprise the gate regions G, the elevated source and drain regions RSn and RSp of the nMOS transistors TN and pMOS transistors TP and the zone 6 of the semiconductor film eon, situated alongside the insulating lateral layers (CI1, CI2, CI4 and CI5) and resting on the flanks of the gate region G of the capacitor C (FIG. 10).

The silicidation method is performed thereafter in a conventional manner known per se, by depositing a metallic layer, for example a nickel-platinum alloy, on the structure of FIG. 10 and then by thermal annealing to form a metal silicide, for example NiPtSi.

Figure 11:
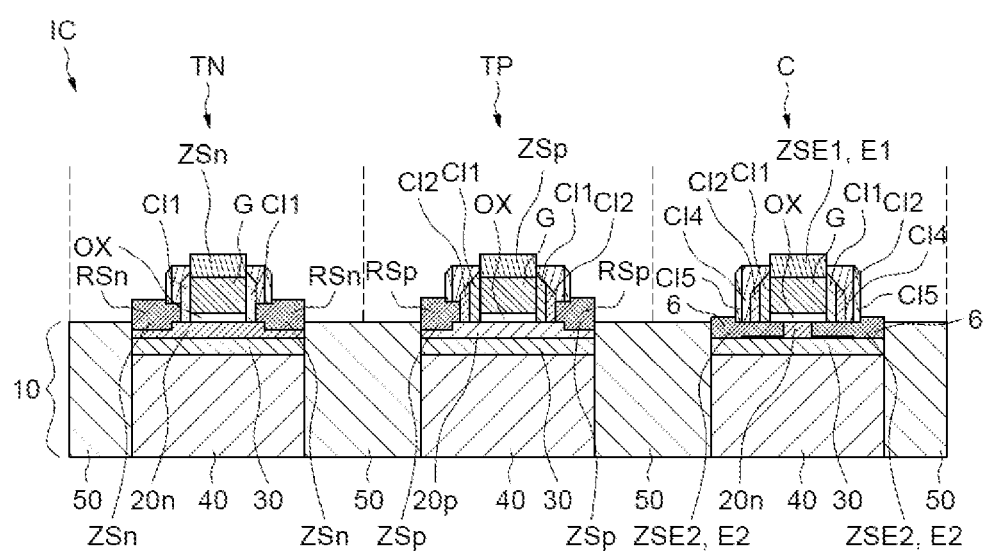

There are then obtained (FIG. 11) silicided zones ZSn and ZSp on the transistors TN and TP, a silicided zone ZSE1 on the gate G of the capacitor C and two silicided zones ZSE2 in the zone 6 of the semiconductor film.

As there has been no epitaxy of semiconductor material on the zone 6 of the semiconductor film 20n of the capacitor C, the metallic silicide ZSE2 formed in the zone 6 extends at least partially under the dielectric layer OX of the capacitor C.

In a case of a short gate, for example, less than 20 nm, it is possible to carry out a silicidation which extends fully under the dielectric layer OX.

Furthermore, the gate regions G can be fully silicided, known per se by the person skilled in the art.

Therefore, the capacitor C comprises a first electrode region E1 obtained by at least partial silicidation ZSE1 of the insulated gate region and a second electrode region E2 obtained by silicidation ZSE2 of the zone 6 of the semiconductor film 20n of the capacitor C. The silicided zones ZSE2 extend at least partially under the dielectric layer OX.

Consequently, the resistance between the two metallic electrode regions of the capacitor C can be reduced so as to decrease de facto the voltage, the breakdown time, and also the reading voltage of the memory cell especially in the case of a programmed memory cell with the capacitor C having suffered breakdown.

What is claimed is:

1. An integrated circuit comprising:
   a silicon-on-insulator substrate that includes a semiconductor film located above a buried insulating layer;
   a first electrode overlying the semiconductor film, the first electrode comprising a silicide material;
   a sidewall insulating material disposed along sidewalls of the first electrode;
   a dielectric layer between the first electrode and the semiconductor film; and
   a second electrode that includes a silicided zone of the semiconductor film, which is located alongside the sidewall insulating material and extends at least partially under the dielectric layer and the first electrode, wherein the first electrode, the dielectric layer and the second electrode form a capacitor that is part of a circuit of the integrated circuit.

2. The integrated circuit according to claim 1, wherein the first electrode further comprises a semiconductor material, the silicide material overlying the semiconductor material.

3. The integrated circuit according to claim 1, wherein the silicided zone of the semiconductor film extends fully under the dielectric layer.

4. The integrated circuit according to claim 1, further comprising a MOS transistor having elevated source and drain regions, the MOS transistor being laterally spaced from the first electrode.

5. The integrated circuit according to claim 1, wherein the first electrode, the dielectric layer and the second electrode form a capacitor that is part of a one-time-programmable memory cell.

6. The integrated circuit according to claim 1, wherein the silicon-on-insulator substrate comprises a fully depleted silicon on insulator (FDSOI) substrate.

7. The integrated circuit according to claim 4, further comprising a second MOS transistor having elevated source and drain regions, the second MOS transistor being laterally spaced from the first electrode and the MOS transistor, wherein the MOS transistor and the second MOS transistor have opposite conductivity types.

8. The integrated circuit according to claim 5, wherein the one-time-programmable memory cell includes no elevated semiconductor regions.

9. An integrated circuit comprising:
   a silicon-on-insulator substrate that includes a semiconductor film located above a buried insulating layer;
   a first capacitor electrode overlying the semiconductor film, the first capacitor electrode comprising a silicide material;
   a first sidewall insulator disposed along sidewalls of the first capacitor electrode;
   a first dielectric layer between the first capacitor electrode and the semiconductor film;
   a second capacitor electrode that includes a silicided zone of the semiconductor film, which is located alongside the first sidewall insulator and extends at least partially under the first dielectric layer and the first capacitor electrode;
   a gate electrode overlying the semiconductor film and spaced from the first capacitor electrode, the gate electrode comprising a silicide material;
   a second sidewall insulator disposed along sidewalls of the gate electrode;
   a second dielectric layer between the gate electrode and the semiconductor film;
   an elevated source region adjacent a first sidewall of the gate electrode and spaced therefrom by the second sidewall insulator, the elevated source region including a silicide region that is spaced from the semiconductor film; and
   an elevated drain region adjacent a second sidewall of the gate electrode and spaced therefrom by the second sidewall insulator, the elevated drain region including a silicide region that is spaced from the semiconductor film.

10. The integrated circuit according to claim 9, wherein the first capacitor electrode and the gate electrode each further comprise a semiconductor material, the silicide material overlying the semiconductor material.

11. The integrated circuit according to claim 9, wherein the silicided zone of the semiconductor film extends fully under the first dielectric layer.

12. The integrated circuit according to claim 9, wherein the first and second capacitor electrodes are part of a one-time-programmable memory cell.

13. The integrated circuit according to claim 9, wherein the silicon-on-insulator substrate comprises a fully depleted silicon on insulator (FDSOI) substrate.

14. The integrated circuit according to claim 12, wherein the one-time-programmable memory cell includes no elevated semiconductor regions.

15. A method of forming an integrated circuit, the method comprising:
   forming a dielectric layer over a silicon-on-insulator substrate that includes a semiconductor film located above a buried insulating layer;
   forming an electrode over the dielectric layer, the electrode comprising a semiconductor material;

forming a sidewall insulator along sidewalls of the electrode; and performing a silicide process to form a first silicide region from semiconductor material of the electrode and a second silicide region from a region of the semiconductor film that extends beneath the sidewall insulator and the electrode, the dielectric layer and the second silicide region forming a capacitor.

16. The method according to claim 15, wherein performing the silicide process comprises forming a second silicide region that extends fully under the dielectric layer.

17. The method according to claim 15, wherein the silicon-on-insulator substrate comprises a fully depleted silicon on insulator (FDSOI) substrate.

18. The method according to claim 15, further comprising:

forming a gate electrode at the same time as forming the electrode, the gate electrode being laterally spaced from the electrode;

forming a gate sidewall insulator along sidewalls of the gate electrode; and forming an elevated source/drain region over the semiconductor film adjacent the gate sidewall insulator, no elevated regions being formed adjacent the electrode, wherein performing the silicide process further comprises forming a third silicide region from a semiconductor material of the elevated source/drain region.

19. The method according to claim 18, wherein performing the silicide process comprises forming a second silicide region that extends fully under the dielectric layer.

20. The method according to claim 18, wherein the silicon-on-insulator substrate comprises a fully depleted silicon on insulator (FDSOI) substrate.

* * * * *